(12) United States Patent
Chen et al.

(10) Patent No.: US 10,978,565 B2
(45) Date of Patent: Apr. 13, 2021

(54) POWER TRANSISTOR DEVICE

(71) Applicant: uPI Semiconductor Corp., Hsinchu County (TW)

(72) Inventors: Chin-Fu Chen, Hsinchu County (TW); Yi-Yun Tsai, Hsinchu County (TW)

(73) Assignee: uPI Semiconductor Corp., Hsinchu County (TW)

(*) Notice: Subject to any disclaimer, the term of this patent is extended or adjusted under 35 U.S.C. 154(b) by 0 days.

(21) Appl. No.: 16/454,072

(22) Filed: Jun. 27, 2019

(65) Prior Publication Data
US 2020/0058745 A1    Feb. 20, 2020

(30) Foreign Application Priority Data
Aug. 17, 2018 (CN) .......................... 201810939923.1

(51) Int. Cl.
*H01L 27/06* (2006.01)
*H01L 27/10* (2006.01)
*H01L 29/40* (2006.01)
*H01L 29/10* (2006.01)
*H01L 29/78* (2006.01)
*H01L 29/06* (2006.01)

(52) U.S. Cl.
CPC ........ *H01L 29/407* (2013.01); *H01L 29/0692* (2013.01); *H01L 29/1095* (2013.01); *H01L 29/404* (2013.01); *H01L 29/7813* (2013.01)

(58) Field of Classification Search
CPC .............. H01L 27/407; H01L 27/0692; H01L 27/1095; H01L 27/404; H01L 27/7813
See application file for complete search history.

(56) References Cited

U.S. PATENT DOCUMENTS

| 7,550,363 | B2 * | 6/2009 | Lee ................... | H01L 21/76229 257/E21.683 |
| 7,800,185 | B2 * | 9/2010 | Hshieh ................. | H01L 29/407 257/401 |
| 7,951,676 | B2 * | 5/2011 | Schmidt .............. | H01L 29/7397 438/268 |
| 7,989,887 | B2 | 8/2011 | Hsieh | |
| 8,080,858 | B2 | 12/2011 | Hirler et al. | |
| 8,415,739 | B2 * | 4/2013 | Venkatraman ...... | H01L 29/7811 257/330 |
| 8,564,024 | B2 * | 10/2013 | Yedinak ............. | H01L 29/0611 257/213 |
| 8,618,594 | B2 * | 12/2013 | Shinbori ............. | H01L 29/7813 257/311 |

(Continued)

FOREIGN PATENT DOCUMENTS

JP   2008085086 A   *   4/2008

*Primary Examiner* — Ida M Soward
(74) *Attorney, Agent, or Firm* — JCIPRNET

(57) ABSTRACT

Provided is a power transistor device including a substrate, a first electrode, and a second electrode. The substrate has an active region and a terminal region. The terminal region surrounds the active region. The substrate includes a first trench and a second trench. The first trench is disposed within the active region and adjacent to the terminal region. The second trench is disposed within the terminal region and adjacent to the active region. The first electrode and the second electrode are respectively disposed in the first trench and the second trench. The first electrode and the second electrode both are electrically floating.

10 Claims, 4 Drawing Sheets

(56) References Cited

U.S. PATENT DOCUMENTS

| | | | |
|---|---|---|---|
| 8,680,613 B2* | 3/2014 | Guan | H01L 29/407 |
| | | | 257/333 |
| 8,759,910 B2 | 6/2014 | Hsieh | |
| 8,957,461 B2* | 2/2015 | Mizushima | H01L 29/0661 |
| | | | 257/155 |
| 9,397,154 B2* | 7/2016 | Padmanabhan | H01L 29/407 |
| 9,576,841 B2* | 2/2017 | Yoshimochi | H01L 29/4238 |
| 9,748,329 B2* | 8/2017 | Yedinak | H01L 29/7813 |
| 9,966,460 B2* | 5/2018 | Soeno | H01L 23/585 |
| 2008/0001217 A1* | 1/2008 | Kawashima | H01L 29/0634 |
| | | | 257/330 |
| 2014/0203411 A1* | 7/2014 | Kato | H01L 29/408 |
| | | | 257/620 |

* cited by examiner

POWER TRANSISTOR DEVICE

CROSS-REFERENCE TO RELATED APPLICATION

This application claims the priority benefit of China application serial no. 201810939923.1, filed on Aug. 17, 2018. The entirety of the above-mentioned patent application is hereby incorporated by reference herein and made a part of this specification.

BACKGROUND OF THE INVENTION

Field of the Invention

The invention relates to a semiconductor device, and more particularly to a power transistor device.

Description of Related Art

A power transistor device is a semiconductor device widely used in analog circuits. Since the power transistor device has very low conductive resistance and very fast switching speed, the power transistor device can be applied to the power switch circuit, thereby enhancing efficiency of the power management techniques.

With the advancement of technology, development of electronic devices has been following the trend of light weight and compact size. As the size of electronic devices continues to shrink, it is becoming more difficult to maintain the high breakdown voltage of the power transistor device. Therefore, how to improve the breakdown voltage of the power transistor device will become an important issue under the trend of smaller device sizes.

SUMMARY OF THE INVENTION

In the present invention, a power transistor device has a first electrode adjacent to a terminal region and a second electrode adjacent to an active region, the first and second electrodes both are electrically floating, thereby increasing a breakdown voltage of the power transistor device.

The invention provides a power transistor device including a substrate, a first electrode, and a second electrode. The substrate has an active region and a terminal region. The terminal region surrounds the active region. The substrate includes a first trench and a second trench. The first trench is disposed within the active region and adjacent to the terminal region. The second trench is disposed within the terminal region and adjacent to the active region. The first electrode and the second electrode are respectively disposed in the first trench and the second trench. The first electrode and the second electrode both are electrically floating.

In an embodiment of the invention, the substrate further includes a third trench disposed within the terminal region and surrounding the active region. The second trench is located between the active region and the third trench, and the third electrode is disposed in the third trench.

In an embodiment of the invention, the third electrode is electrically floating.

In an embodiment of the invention, the third electrode is electrically connected to a drain.

In an embodiment of the invention, the first electrode and the second electrode are the same electrode.

In an embodiment of the invention, the substrate further includes a fourth trench disposed within the active region. The first trench is located between the fourth trench and the second trench, the fourth trench has a trench gate structure. The trench gate structure includes a first conductive layer and a second conductive layer located on the first conductive layer.

In an embodiment of the invention, the first electrode, the second electrode, and the first conductive layer are fabricated in the same process.

In an embodiment of the invention, the substrate further includes a fifth trench and a sixth trench. The fifth trench is disposed within the terminal region and having a fourth electrode disposed in the fifth trench. The sixth trench is disposed within the terminal region, and having a fifth electrode disposed in the sixth trench. The fourth electrode and the fifth electrode are electrically insulated from the substrate. The fourth electrode is located between the second electrode and the fifth electrode. A potential of the fourth electrode and a potential of the fifth electrode are between a source potential and a drain potential.

In an embodiment of the invention, the potential of the fourth electrode is between the potential of the fifth electrode and the source potential.

In an embodiment of the invention, the substrate further includes a seventh trench disposed within the terminal region and having a sixth electrode. The sixth electrode is electrically insulated from the substrate. The sixth electrode is located between the fourth electrode and the fifth electrode and a potential of the sixth electrode is between the potential of the fourth electrode and the potential of the fifth electrode.

Based on the above, in one embodiment of the present invention, the power transistor device has the first electrode adjacent to the terminal region and the second electrode adjacent to the active region, and the first and second electrodes both are electrically floating, thereby increasing the breakdown voltage of the power transistor device. In another embodiment of the present invention, the outermost trench electrode structure in the terminal region is electrically connected to the drain, thereby relieving or even eliminating the electric field distortion at the edge of the trench electrode structure in the terminal region. Further, in other embodiments of the present invention, the potential of at least two trench electrode structures in the terminal region is between the source potential and the drain potential capable of further improving the breakdown voltage of the power transistor device. In this way, the power transistor device of the present invention is able to have better device characteristics at a given device size.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
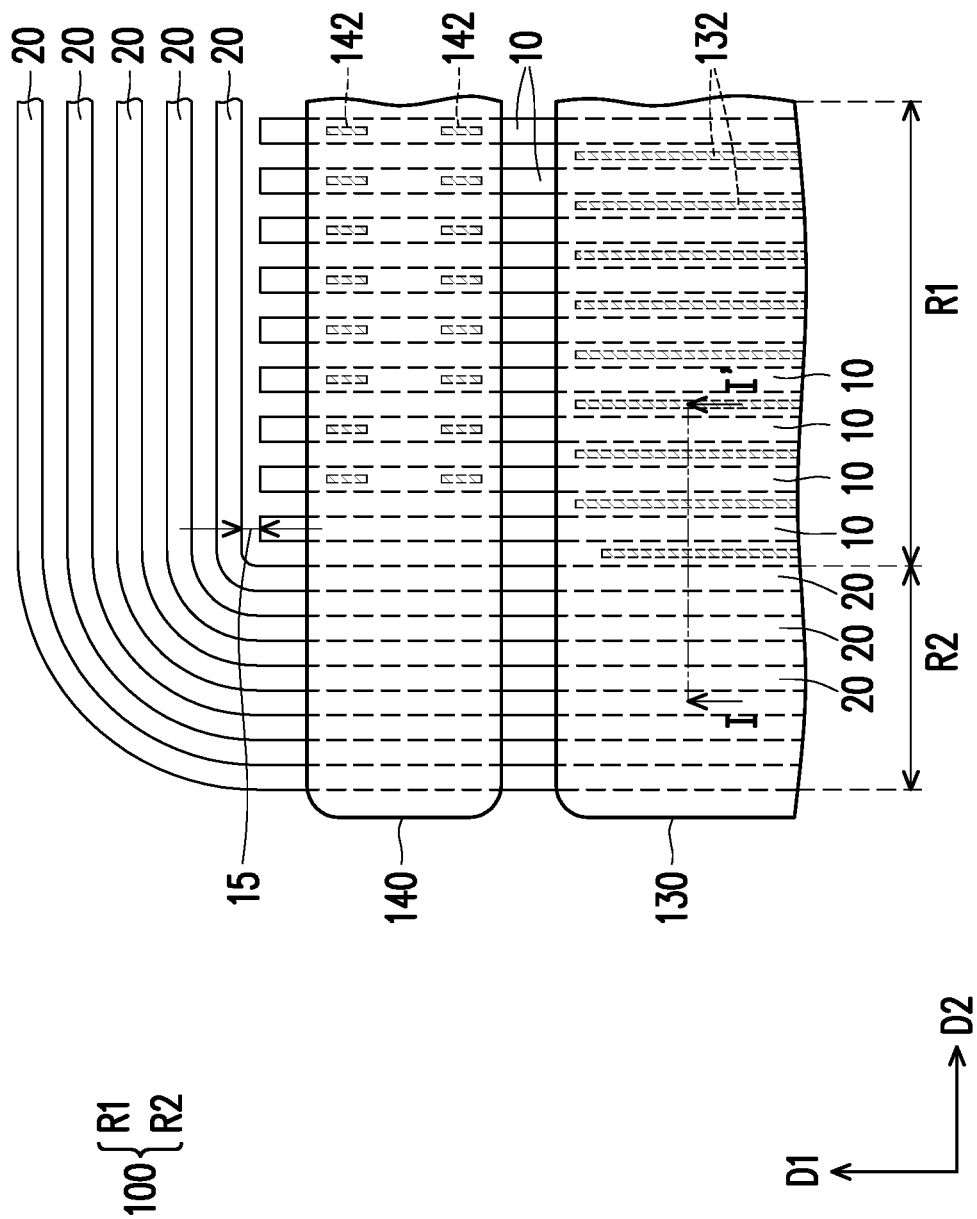
FIG. 1A is a top view of a power transistor device according to a first embodiment of the present invention.

The invention is more comprehensively described with reference to the figures of the present embodiments. However, the invention may also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

Figure 1B:
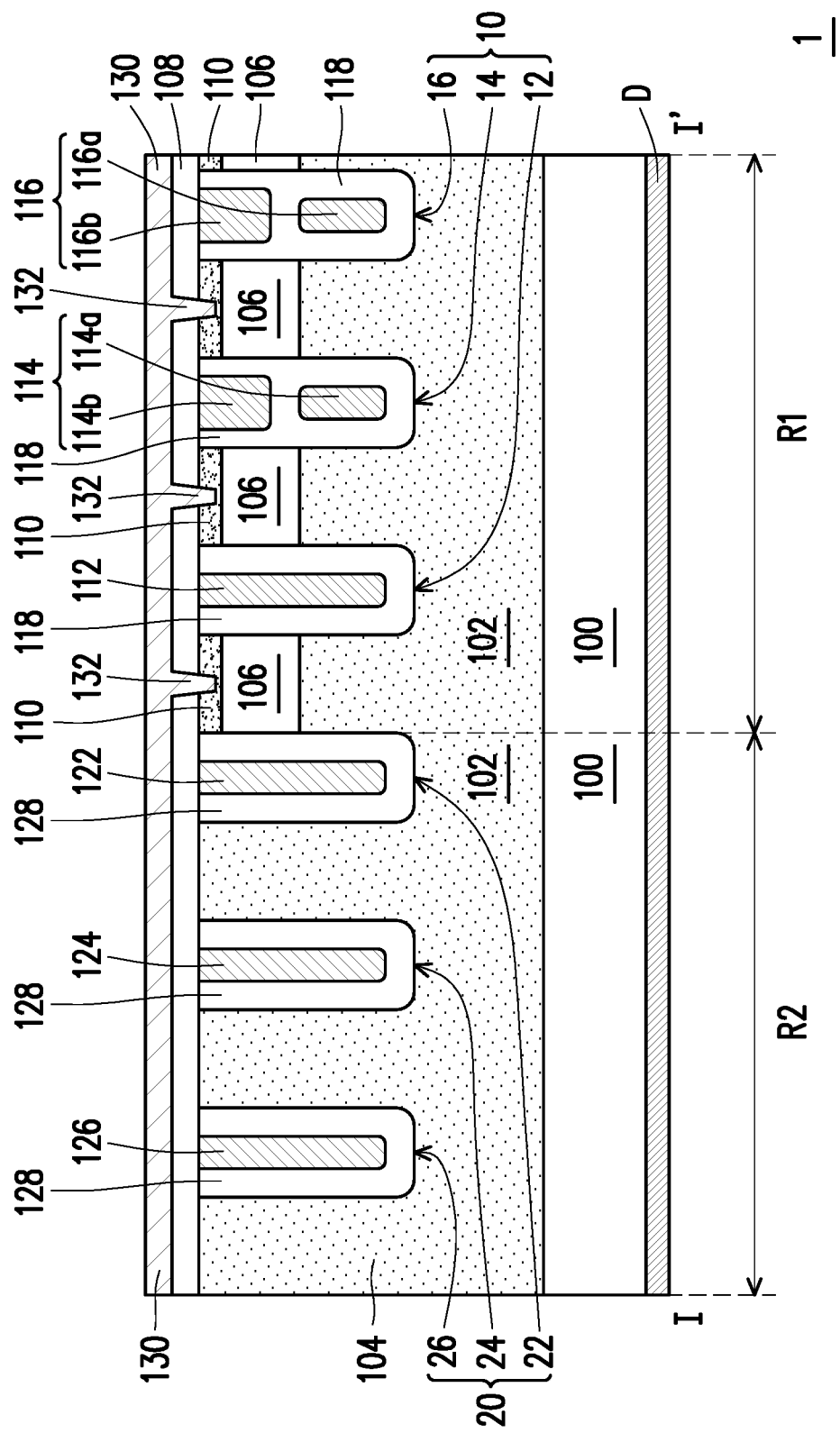
FIG. 1B is a schematic cross-sectional view taken along line I-I' of FIG. 1A.

FIG. 1A is a top view of a power transistor device according to a first embodiment of the present invention. FIG. 1B is a schematic cross-sectional view taken along line I-I' of FIG. 1A. In the following embodiments, a first conductivity type is an N type and a second conductivity type is a P type. However, the present invention is not limited thereto. Those skilled in the art should understand that the first conductivity type may also be the P type, while the second conductivity type is the N type.

Referring to FIG. 1A and FIG. 1B, in the first embodiment of the present invention, a power transistor device 1 includes a substrate 100 having an active region R1 and a terminal region R2. The terminal region R2 surrounds the active region R1 to prevent breakdown from occurring. The substrate 100 is a semiconductor substrate or a semiconductor compound substrate, for example. In the embodiment, the substrate 100 may be a semiconductor substrate having a first conductivity type, such as an N-type heavily doped silicon substrate.

As shown in FIG. 1A, the active region R1 has a plurality of active trenches 10. The active trenches 10 extend along a first direction D1 and are arranged along a second direction D2. In one embodiment, the active trenches 10 are arranged in an equidistant manner and are separated from one another. In alternative embodiments, at least one end face of one active trench 10 is substantially aligned with that of another active trench 10.

In addition, the terminal region R2 has a plurality of terminal trenches 20. As shown in FIG. 1A, the terminal trenches 20 extend along the first direction D1 and surround the active trenches 10 in active region R1, so as to form closed annular trenches. The terminal trenches 20 are separated from the active trenches 10 and are not connected to one another. The first direction D1 intersects the second direction D2. In an embodiment, the first direction D1 is perpendicular to the second direction D2.

From the cross-sectional point of view, as shown in FIG. 1B, a first epitaxial layer 102 is disposed on the substrate 100 in the active region R1 and the terminal region R2. In one embodiment, the first epitaxial layer 102 is an epitaxial layer having the first conductivity type, such as an N-type lightly doped epitaxial layer, and may be formed by a selective epitaxy growth (SEG) process. In addition, a drain D is located below the substrate 100, such that the substrate 100 is located between the first epitaxial layer 102 and the drain D.

As shown in FIG. 1B, the active trenches 10 are disposed in the first epitaxial layer 102 of the active region R1, and the terminal trenches 20 are disposed in the first epitaxial layer 102 of the terminal region R2. Specifically, the active trenches 10 include a first active trench 12, a second active trench 14, and a third active trench 16. The first active trench 12, the second active trench 14 and the third active trench 16 are separated from each other and are not connected to each other. The first active trench 12 (which may be considered as a first trench) are located near or adjacent to the terminal region R2, and the second active trench 14 are located between the first active trench 12 and the third active trench 16.

In an embodiment, the first active trench 12 have an electrode structure 112 (which may be considered as a first electrode) and an insulating layer 118 therein. The insulating layer 118 wraps or covers a bottom surface and a sidewall of the electrode structure 112, such that the electrode structure 112 is electrically insulated from the first epitaxial layer 102 or the substrate 100. In an embodiment, a material of the electrode structure 112 includes a conductive material, such as a doped polysilicon. A material of the insulating layer 118 includes silicon oxide.

In an embodiment, the second active trench 14 (which may be considered as a fourth trench) have a trench electrode structure 114 and the insulating layer 118 therein. The trench electrode structure 114 includes a conductive layer 114a (which may be regarded as a first conductive layer) and a conductive layer 114b (which may be regarded as a second conductive layer) on the conductive layer 114a. In an embodiment, the conductive layer 114a may be used as a shielding electrode; the conductive layer 114b may be used as a gate and electrically connected to a gate electrode 140 through plugs 142 (as shown in FIG. 1A). A portion of the insulating layer 118 may be used as an inter-gate insulating layer between the gate (the conductive layer 114b) and the shielding gate (the conductive layer 114a), so that the conductive layers 114a, 114b are electrically insulated from each other. In addition, another portion of the insulating layer 118 surrounding the trench electrode structure 114 is able to electrically insulate the trench electrode structure 114 from the first epitaxial layer 102, a body layer 106, and a doped region 110. Although the conductive layers 114a, 114b separated from each other are illustrated in FIG. 1B, the invention is not limited thereto. In other embodiments, the conductive layers 114a, 114b may also be connected to each other, so as to form a single gate. In an embodiment, a material of the conductive layers 114a, 114b may be a doped polysilicon, for example.

Similarly, the third active trench 16 has a trench electrode structure 116 and the insulating layer 118 wrapping the trench electrode structure 116 therein. The structure of the third active trench 16 is the same as that of the second active trench 14, and will not be repeated here.

On the other hand, the terminal trenches 20 include a first terminal trench 22, a second terminal trench 24, and a third terminal trench 26. The first terminal trench 22, the second terminal trench 24 and the third terminal trench 26 are separated from one another and are not connected to one another. The first terminal trench 22 (which may be considered as a second trench) is adjacent to the active region R1, and the first terminal trench 22 is located between the active region R1 and the second terminal trench 24. The second terminal trench 24 is located between the first terminal trench 22 and the third terminal trench 26. Although only three terminal trenches 22, 24, 26 are illustrated in FIG. 1B, the invention is not limited thereto. In other embodiments, the terminal trenches 20 may have only one or more terminal trenches.

In an embodiment, the first terminal trench 22 has an electrode structure 122 (which may be considered as a second electrode) and an insulating layer 128 therein. The insulating layer 128 wraps or covers a bottom surface and a sidewall of the electrode structure 122, such that the electrode structure 122 is electrically insulated from the first epitaxial layer 102 or the substrate 100. In an embodiment, a material of the electrode structure 122 includes a conductive material, such as a doped polysilicon. A material of the insulating layer 128 includes silicon oxide.

It should be noted that the electrode structures 112 and 122 are electrically floating. In one embodiment, the electrode structure 112 and the electrode structure 122 are the same electrode. In the present embodiment, the electrode structure 112 and the electrode structure 122 are fabricated simultaneously, namely, fabricated in the same process or step. In addition, the electrode structure 112, the electrode structure 122, the conductive layer 114a, and the conductive layer 116a may all be fabricated in the same process or step.

In this case, the present embodiment is able to maintain the electric field there by the charge stored in the electrode structures 112 and 122, so as to increase the breakdown voltage of the power transistor device 1. On the other hand, the present embodiment is able to allow the gap 15 (shown in FIG. 1A) between the electrode structures 112 and 122 to be slightly increased or decreased, while maintaining the breakdown voltage of the power transistor device 1. That is to say, the present embodiment is able to increase a process window of the power transistor device 1.

In an embodiment, the second terminal trench 24 (which may be considered as a third trench) have an electrode structure 124 (which may be considered a third electrode) and the insulating layer 128 therein. The structure of the second terminal trench 24 is the same as that of the first terminal trench 22 and will not be repeated here.

In an embodiment, the third terminal trench 26 has an electrode structure 126 and the insulating layer 128 therein. The structure of the third terminal trench 26 is the same as that of the first terminal trench 22 and will not be repeated here.

In an embodiment, the electrode structures 124, 126 may also be electrically floating to further increase the breakdown voltage of the power transistor device 1. Although only three electrode structures 122, 124, and 126, are illustrated in FIG. 1B, the present invention is not limited thereto. As long as at least one electrode structure 122 is arranged in the first epitaxial layer 102 of the terminal region R2 adjacent to the active region R1, and is electrically floating, it is within the scope of the present invention. In other embodiments, the number of floating electrode structures in the terminal region R2 may be adjusted according to the trench pitch, the pitch of the gap 15, and the doping concentration of the first epitaxial layer 102. For example, when the trench pitch or the pitch of the gap 15 is greater, and alternatively the first epitaxial layer 102 has a greater doping concentration, the number of the electrode structures in the terminal region R2 may be reduced. On the contrary, the number of electrode structures in the terminal region R2 may be increased. In alternative embodiments, the number of floating electrode structures in the terminal region R2 may be from 1 to 4.

Referring to FIG. 1B, the power transistor device 1 further includes the body layer 106, the doped region 110, a dielectric layer 108, and a conductive layer 130 and plugs 132. Specifically, the body layer 106 is disposed in the first epitaxial layer 102 between the active trenches 10 and between the first active trench 12 and the first terminal trench 22. As shown in FIG. 1B, the body layer 106 surrounds the active trenches 10. In an embodiment, the body layer 106 has the second conductivity type, such as a P-type body layer. The doped region 110 is disposed in the body layer 106 and surrounds the upper portions of the active trenches 10. In an embodiment, the doped region 110 has the first conductivity type, such as an N-type heavily doped region. In an embodiment, the doped region 110 may be used as a source.

As shown in FIG. 1B, the dielectric layer 108 is disposed on the first epitaxial layer 102. The conductive layer 130 is disposed on the dielectric layer 108, and the dielectric layer 108 is disposed between the conductive layer 130 and first epitaxial layer 102. The plugs 132 extend from a bottom surface of the conductive layer 130 through the dielectric layer 108 to contact with the doped region 110 (or the source). In other words, the conductive layer 130 is electrically connected to the doped region 110 (or the source) through the plugs 132. In an embodiment, a material of the dielectric layer 108 includes silicon oxide. A material of the plugs 132 and the conductive layer 130 includes a conductive material, which may be metal such as aluminum, copper, tungsten, or a combination thereof.

Figure 2:
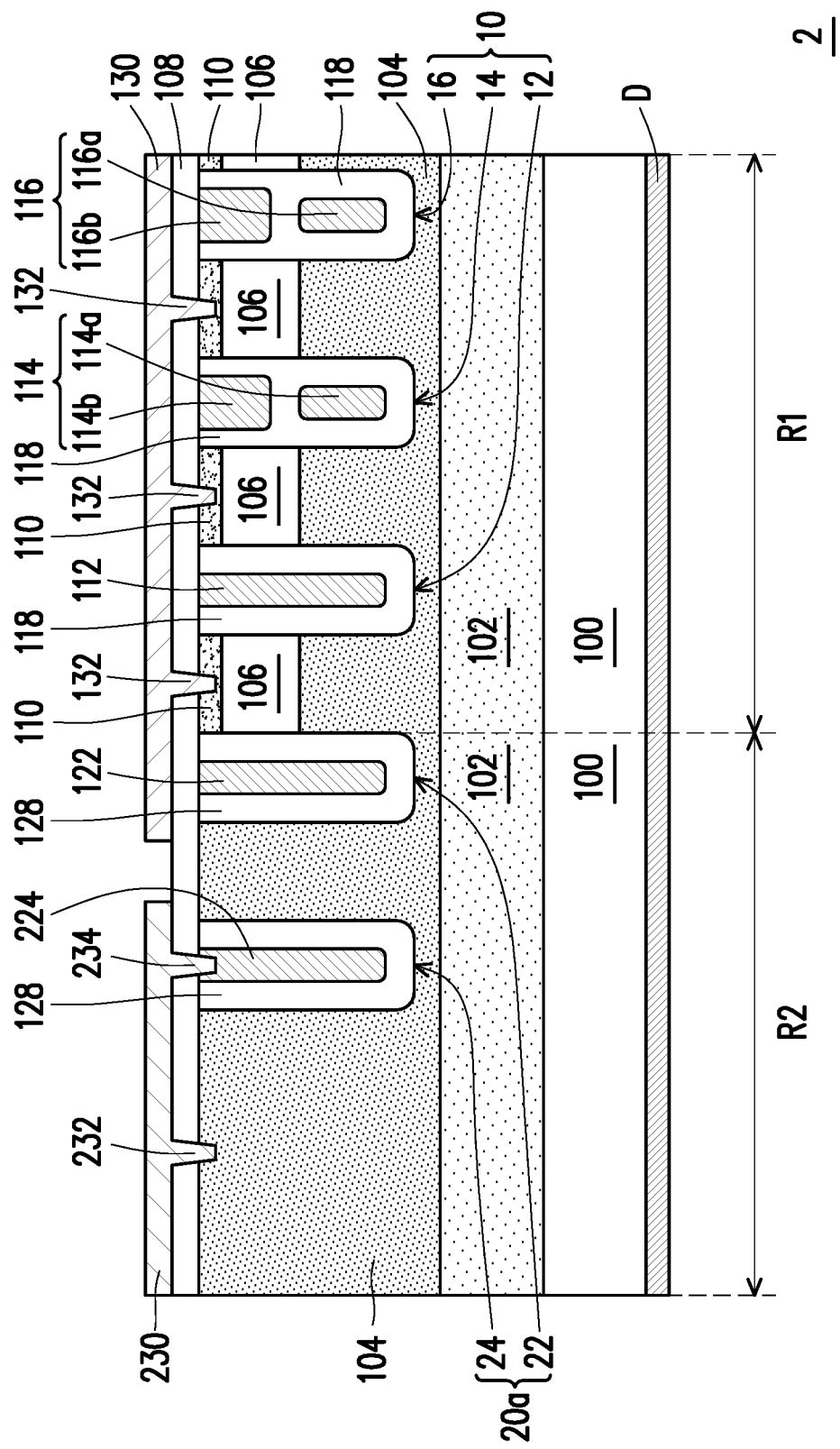
FIG. 2 is a cross-sectional view of a power transistor device according to a second embodiment of the present invention.

FIG. 2 is a cross-sectional view of a power transistor device according to a second embodiment of the present invention.

Referring to FIG. 2, in the second embodiment of the present invention, a power transistor device 2 includes a substrate 100, a first epitaxial layer 102, a second epitaxial layer 104, and a drain D. Specifically, the substrate 100 has an active region R1 and a terminal region R2. The arrangement of the active region R1 and the terminal region R2 of the second embodiment is similar to that of FIG. 1A and FIG. 1B, and details are not repeated here.

As shown in FIG. 2, the first epitaxial layer 102 is disposed on the substrate 100 of the active region R1 and the terminal region R2. The second epitaxial layer 104 is disposed on the first epitaxial layer 102. That is, the first epitaxial layer 102 is disposed between the substrate 100 and the second epitaxial layer 104. In an embodiment, the first epitaxial layer 102 and the second epitaxial layer 104 are epitaxial layers having a first conductivity type, such as an N-type lightly doped epitaxial layer, and may be formed by a selective epitaxial growth process. The doping concentration of the second epitaxial layer 104 is greater than the doping concentration of the first epitaxial layer 102 to form a double epitaxial structure. The double epitaxial structure is able to reduce the conductive impedance (Ron) of the power transistor device 2. In addition, the drain D is disposed below the substrate 100, such that the substrate 100 is located between the first epitaxial layer 102 and the drain D.

As shown in FIG. 2, the active region R1 has a plurality of active trenches 10 which are disposed in the second epitaxial layer 104 of the active region R1. The active trenches 10 includes a first active trench 12, a second active trench 14 and a third active trench 16. In an embodiment, an electrode structure 112 (which may be considered as a first electrode structure) and an insulating layer 118 wrapping or covering the electrode structure 112 are disposed in the first active trench 12. A trench electrode structure 114 and the insulating layer 118 wrapping or covering the trench electrode structure 114 are disposed in the second active trench 14. A trench electrode structure 116 and the insulating layer 118 wrapping or covering the trench electrode structure 116 are disposed in the third active trench 16. The materials of the electrode structure 112, the trench electrode structure 114, 116, and the insulating layer 118 has been described in the above paragraphs, and will not be repeated here.

The terminal region R2 has a plurality of terminal trenches 20a which is disposed in the second epitaxial layer 104 of the terminal region R2. Specifically, the terminal trenches 20a includes a first terminal trench 22 and a second terminal trench 24. The first terminal trench 22 is disposed between the second terminal trench 24 and the first active trench 12. An electrode structure 122 (which may be considered as a second electrode) and an insulating layer 128 wrapping or covering the electrode structure 122 are disposed in the first terminal trench 22. An electrode structure 224 (which may be considered as a third electrode) and the insulating layer 128 wrapping or covering the electrode structure 224 are disposed in the second terminal trench 24. The material of the electrode structure 224 is similar to the material of the electrode structure 122, and the materials of the electrode structure 122 and the insulating layer 128 have been described in the above paragraphs, and will not be repeated here.

It should be noted that the electrode structures 112 and 122 are both electrically floating, and the electrode structure 224 is electrically connected to the drain D. In this case, the present embodiment is able to maintain the electric field there by the charge stored in the electrode structures 112 and 122, so as to increase the breakdown voltage of the power transistor device 2. In addition, since the electrode structure 224 is electrically connected to the drain D and is used as the isolation trench, the line of electric force is restricted at the edge of the electrode structure 224 in the second terminal trench 24, thereby relieving or even eliminating the electric field distortion at the edge of the electrode structure 224 and further improving the breakdown voltage of the power transistor device 2. In an embodiment, the electric field distortion is caused by the difference in the doping concentrations of the first epitaxial layer 102 and the second epitaxial layer 104. In other words, in the present embodiment, the outermost trench electrode is electrically connected to the drain, so as to improve the breakdown voltage of the power transistor device. In this way, the power transistor device of the embodiment is able to have a better conductive resistance and breakdown voltage at a given device size. In alternative embodiments, according to the degree of difference between the doping concentrations of the first epitaxial layer 102 and the second epitaxial layer 104, the number of the second terminal trenches 22 may be greater than one (e.g., two, three, four or more), and the electrode structure 224 in each second terminal trench 22 may be electrically connected to the drain D.

As shown in FIG. 2, the electrode structure 224 in the second terminal trench 24 may be electrically connected to the drain D through plugs 232, 234 and a conductive layer 230. Specifically, the plug 232 extends from a bottom surface of the conductive layer 230 and penetrates through the dielectric layer 108 to contact with the second epitaxial layer 104. The plug 234 extends from the bottom surface of the conductive layer 230 and penetrates through the dielectric layer 108 to contact with the electrode structure 224. Since the substrate 100, the first epitaxial layer 102, and the second epitaxial layer 104 have the same conductivity type (e.g., N-type), the electrode structure 224 is able to be electrically connected to the drain D on the bottom of the substrate 100 through the plug 234, the conductive layer 230, the plug 232, the second epitaxial layer 104, the first epitaxial layer 102, and the substrate 100. That is, the electrode structure 224 in the second terminal trench 24 has the same potential as the drain D. In an embodiment, the materials of the plugs 232, 234 and the conductive layer 230 respectively include a conductive material which may be metals, such as aluminum, copper, tungsten or a combination thereof. The material of the dielectric layer 108 includes silicon oxide.

In addition, the power transistor device 2 further includes a body layer 106, a doped region 110, a dielectric layer 108, a conductive layer 130, and plugs 132. As shown in FIG. 2, the body layer 106 is disposed in the second epitaxial layer 104 between the active trenches 10. The body layer 106 surrounds the active trenches 10. The doped region 110 (which may be considered as a source) is disposed in the body layer 106 and surrounds upper portions of the active trenches 10. The dielectric layer 108 is disposed on the second epitaxial layer 104. The conductive layer 130 is disposed on the dielectric layer 108. The plugs 132 extend from a bottom surface of the conductive layer 130 and penetrate through the dielectric layer 108 to be in contact with or electrically connected to the doped region 110 (or the source). The materials of the body layer 106, the doped region 110, the dielectric layer 108, the conductive layer 130, and the plug 132 have been described in the above paragraphs, and will not be repeated here. In addition, although the conductive layers 130 and 230 shown in FIG. 2 are at the same level or height, the present invention is not limited thereto. In other embodiments, the conductive layers 130, 230 may be at different levels or heights.

Figure 3:
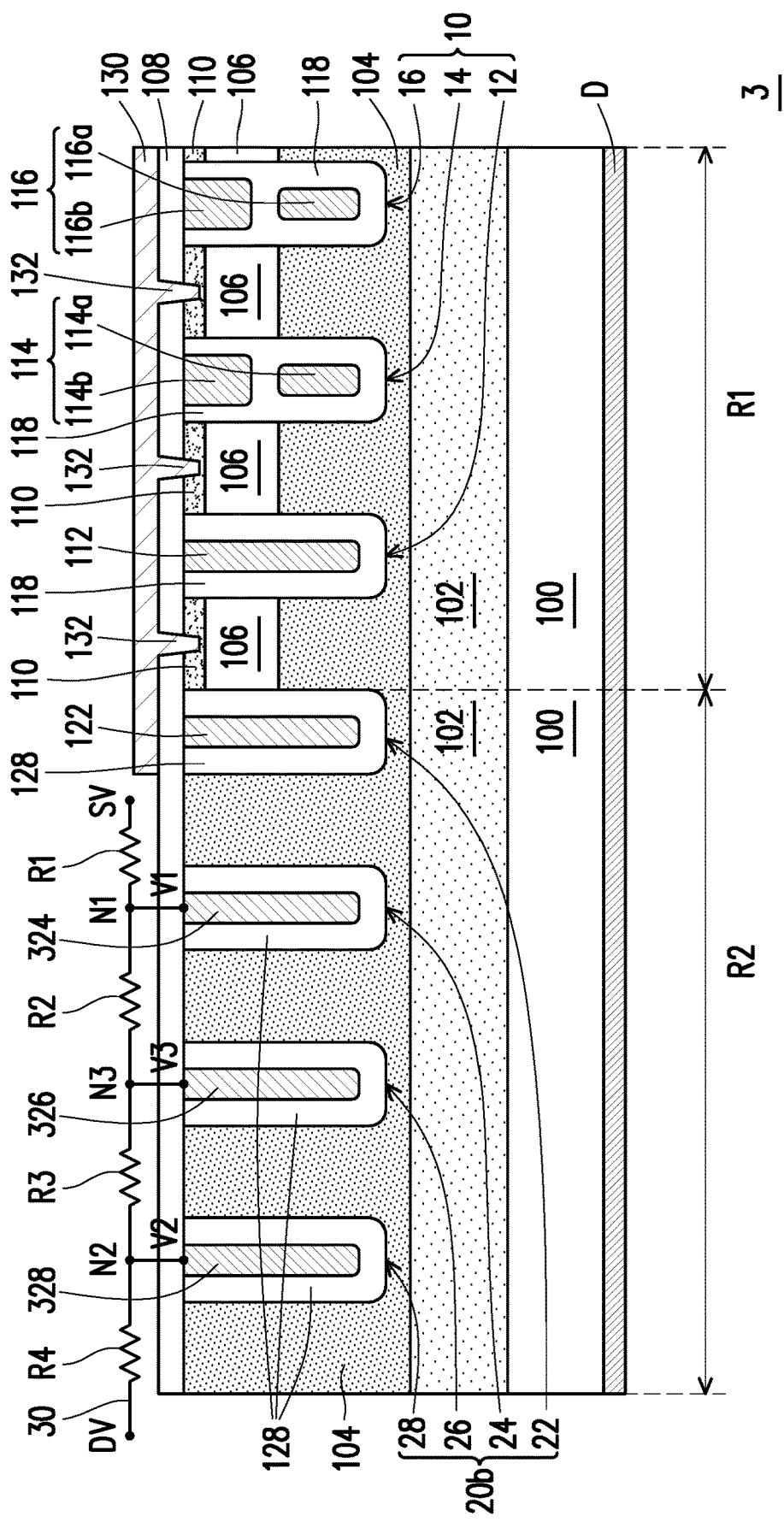
FIG. 3 is a cross-sectional view of a power transistor device according to a third embodiment of the present invention.

FIG. 3 is a cross-sectional view of a power transistor device according to a third embodiment of the present invention.

Referring to FIG. 3, a power transistor device 3 of the third embodiment is similar to the power transistor device 2 of the second embodiment. Similar or identical components are represented by similar or identical reference numerals, and their material and arrangement are described in the above paragraphs, and will not be repeated here. The difference therebetween lies in that terminal trenches 20b of a power transistor device 3 of the third embodiment include a first terminal trench 22, a second terminal trench 24, a third terminal trench 26, and a fourth terminal trench 28. The first terminal trench 22 is close to the active region R1. The first terminal trench 22 is located between the active region R1 and the second terminal trench 24. The third terminal trench 26 is located between the second terminal trench 24 and the fourth terminal trench 28.

In an embodiment, an electrode structure 122 (which may be considered as a second electrode) and an insulating layer 128 wrapping the electrode structure 122 are disposed in the first terminal trench 22 (which may be considered as a second trench). An electrode structure 324 (which may be considered as a fourth electrode) and the insulating layer 128 wrapping the electrode structure 324 is disposed in the second terminal trench 24 (which may be considered as a fifth trench). An electrode structure 326 (which may be considered as a sixth electrode) and the insulating layer 128 wrapping the electrode structure 326 is disposed in the third terminal trench 26 (which may be considered as a seventh trench. An electrode structure 328 (which may be considered as a fifth electrode) and the insulating layer 128 wrapping the electrode structure 328 is disposed in the fourth terminal trench 28 (which may be considered as a sixth trench). The materials of the electrode structures 324, 326, 328 are similar to the material of the electrode structure 122, and the materials of the electrode structure 122 and the insulating layer 128 have been described in the above paragraphs, and will not be repeated here.

As shown in FIG. 3, the power transistor device 3 of the present embodiment further includes a resistor device 30 coupled between a source potential SV and a drain potential DV. In other words, the resistor device 30 is electrically connected to the electrode structures 324, 326, 328, while the electrode structure 122 is electrically floating. Specifically, the resistor device 30 may be a plurality of resistors R1, R2, R3, and R4 connected in series. The electrode structure 324 is electrically connected to a node N1 between the resistors R1 and R2; the electrode structure 328 is electrically connected to a node N2 between the resistors R3 and R4; the electrode structure 326 is electrically connected to a node N3 between resistors R2 and R3.

In the arrangement, a potential V1 of the electrode structure 324, a potential V2 of the electrode structure 328, and a potential V3 of the electrode structure 326 are between the source potential SV and the drain potential DV by using a resistive voltage dividing way. As a result, the lines of electric force in the terminal region R2 may be distributed evenly to relieve or even eliminate the electric field distortion at the edge of the electrode structure 328, thereby improving the breakdown voltage of the power transistor device 3.

In an embodiment, as shown in FIG. 3, the electrode structure 324 is close to the source potential SV; the electrode structure 328 is close to the drain potential DV. As a result, the potential V1 of the electrode structure 324 is between the potential V2 of the electrode structure 328 and the source potential SV. Additionally, the electrode structure 326 is disposed between the electrode structure 324 and the electrode structure 328. Similarly, the potential V3 of the electrode structure 326 is between the potential V1 of the electrode structure 324 and the potential V2 of the electrode structure 328. That is, the potential of the trench electrode in the terminal region R2 is gradually changed in a direction from the source to the drain. In the present embodiment, the potential of the trench electrode in the terminal region R2 is increased in the direction from the source to the drain. In other words, the potential V2 of the electrode structure 328 is greater than the potential V3 of the electrode structure 326, and the potential V3 of the electrode structure 326 is greater than the potential V1 of the electrode structure 324. However, present invention is not limited thereto.

In an embodiment, from the top view, the resistor device 30 may be linear, which surrounds the terminal region R2 along a spiral-shaped path. The electrode structures 324, 326, 328 may be connected to the resistor device 30 at different line segments. In the present invention, the resistance value of the resistors R1, R2, R3, and R4 is able to be adjusted by the length of the linear resistor device 30. In detail, the longer the length of the linear resistor device 30 is, the higher its resistance value is. In an embodiment, a material of the resistor device 30 may be, a doped polycrystalline silicon or a non-doped polycrystalline silicon, for example.

In summary, in one embodiment of the present invention, the power transistor device has the first electrode adjacent to the terminal region and the second electrode adjacent to the active region, and the first and second electrodes both are electrically floating, thereby increasing the breakdown voltage of the power transistor device. In another embodiment of the present invention, the outermost trench electrode structure in the terminal region is electrically connected to the drain, thereby relieving or even eliminating the electric field distortion at the edge of the trench electrode structure in the terminal region. Further, in other embodiments of the present invention, the potential of at least two trench electrode structures in the terminal region is between the source potential and the drain potential capable of further improving the breakdown voltage of the power transistor device. In this way, the power transistor device of the present invention is able to have better device characteristics at a given device size.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A power transistor device, comprising:
a substrate having an active region and a terminal region, the terminal region surrounding the active region, wherein the substrate comprises:
a first trench disposed within the active region and adjacent to the terminal region;
a second trench disposed within the terminal region and adjacent to the active region; and
a first electrode and a second electrode respectively disposed in the first trench and the second trench, wherein the first electrode and the second electrode are electrically floating.

2. The power transistor device of claim 1, further comprising a third trench disposed within the terminal region and surrounding the active region, wherein the second trench is located between the active region and the third trench, and a third electrode is disposed in the third trench.

3. The power transistor device of claim 2, wherein the third electrode is electrically floating.

4. The power transistor device of claim 2, wherein the third electrode is electrically connected to a drain.

5. The power transistor device of claim 1, wherein the first electrode and the second electrode are the same electrode.

6. The power transistor device of claim 1, further comprising a fourth trench disposed within the active region, the first trench located between the fourth trench and the second trench, wherein the fourth trench has a trench gate structure, the trench gate structure comprises a first conductive layer and a second conductive layer located on the first conductive layer.

7. The power transistor device of claim 6, wherein the first electrode, the second electrode, and the first conductive layer are fabricated in the same process.

8. The power transistor device of claim 1, wherein the substrate further comprises:
a fifth trench disposed within the terminal region, and having a fourth electrode disposed in the fifth trench; and
a sixth trench disposed within the terminal region, and having a fifth electrode disposed in the sixth trench, wherein the fourth electrode and the fifth electrode are electrically insulated from the substrate, and the fourth electrode is located between the second electrode and the fifth electrode, and a potential of the fourth electrode and a potential of the fifth electrode are between a source potential and a drain potential.

9. The power transistor device of claim 8, wherein the potential of the fourth electrode is between the potential of the fifth electrode and the source potential.

10. The power transistor device of claim 8, wherein the substrate further comprises a seventh trench disposed within the terminal region and having a sixth electrode, the sixth electrode electrically insulated from the substrate, wherein the sixth electrode is located between the fourth electrode and the fifth electrode, and a potential of the sixth electrode is between the potential of the fourth electrode and the potential of the fifth electrode.

* * * * *